US005531022A

United States Patent [19]
Beaman et al.

[11] Patent Number: 5,531,022
[45] Date of Patent: Jul. 2, 1996

[54] METHOD OF FORMING A THREE DIMENSIONAL HIGH PERFORMANCE INTERCONNECTION PACKAGE

[75] Inventors: Brain S. Beaman, Hyde Park; Fuad E. Doany, Katonah; Keith E. Fogel, Bardonia, all of N.Y.; James L. Hedrick, Jr., Oakland, Calif.; Paul A. Lauro, Nanuet, N.Y.; Maurice H. Norcott, Valley Cottage, N.Y.; John J. Ritsko, Mt. Kisco, N.Y.; Leathen Shi, Yorktown Heights, N.Y.; Da-Yuan Shih, Poughkeepsie, N.Y.; George F. Walker, New York, N.Y.

[73] Assignee: International Business Machines Corporation, Armonk, N.Y.

[21] Appl. No.: 300,620

[22] Filed: Sep. 2, 1994

Related U.S. Application Data

[62] Division of Ser. No. 963,346, Oct. 19, 1992, Pat. No. 5,371,654.

[51] Int. Cl.⁶ ............................... H05K 3/40; H01R 9/09
[52] U.S. Cl. .................. 29/850; 29/848; 29/DIG. 29; 439/66
[58] Field of Search .................... 29/830, 848, 850, 29/853, DIG. 12, DIG. 16, DIG. 29; 439/66, 67, 91, 591; 264/272.13, 272.15, 272.17

[56] References Cited

U.S. PATENT DOCUMENTS

| | | | |
|---|---|---|---|
| 2,961,746 | 11/1960 | Lyman | 29/848 |
| 3,430,338 | 3/1969 | Flaherty | 29/848 X |
| 3,557,446 | 1/1971 | Charschan | 29/853 |
| 3,795,037 | 3/1974 | Luttmer | 439/591 X |
| 3,889,363 | 6/1975 | Davis | 29/848 |
| 4,329,780 | 5/1982 | Somers | 29/848 |
| 4,793,814 | 12/1988 | Zifcak et al. | 439/66 |

*Primary Examiner*—Peter Vo
*Attorney, Agent, or Firm*—Daniel P. Morris

[57] ABSTRACT

The present invention is directed to a structure for packaging electronic devices, such as semiconductor chips, in a three dimensional structure which permits electrical signals to propagate both horizontally and vertically. The structure is formed from a plurality of assemblies. Each assembly is formed from a substrate having disposed on at least one surface a plurality of electronic devices. Each assembly is disposed in a stack of adjacent assemblies. Between adjacent assemblies there is an electrical interconnection means electrically interconnecting each assembly. The electrical interconnection means is formed from an elastomeric interposer. The elastomeric interposer is formed from an elastomeric material having a plurality of electrical conductors extending therethrough, either in a clustered or un-clustered arrangement. The electrical interconnection means is fabricated having a plurality of apertures extending therethrough. The array of apertures corresponds to the array of electronic devices on the substrates. The aperture and electrical interconnection means is disposed over the array of electronic devices so that the electrical interconnection means is between adjacent electronic devices. The stack of assemblies is compressed thereby compressing the electrical interconnection means between adjacent assemblies. The substrate or each assembly is formed from a thermally conductive material such as diamond. A heat dissipation means is thermally connected to the edges of the substrate to extract heat generated within the structure. Methods for fabricating the electrical interconnection means as a stand alone elastomeric sheet are described. The ends of the plurality of conductors in the electrical interconnection means are fabricated so that upon compression between adjacent assemblies there is a wiping action between the conductor ends and contact locations on the adjacent assemblies to form a good electrical contact therewith.

15 Claims, 12 Drawing Sheets

METHOD OF FORMING A THREE DIMENSIONAL HIGH PERFORMANCE INTERCONNECTION PACKAGE

This is a division of application Ser. No. 07/963,346, filed Oct. 19, 1992, U.S. Pat. No. 5,371,654.

FIELD OF THE INVENTION

The present invention is directed to packaging structures for interconnecting electronic devices in a three dimensional structure. More particularly, the present invention is directed to a structure having a plurality of substrates wherein each substrate has a plurality of electronic devices thereon forming an assembly. There are a plurality of assemblies disposed one on top of each other with a vertical wiring interconnection structure disposed between adjacent assemblies. Most particularly, the vertical wire interconnection structure contains a plurality of electrical conductors disposed in an elasomteric material and is compressed between adjacent assemblies.

BACKGROUND OF THE INVENTION

In the microelectronics industry, integrated circuits, such as semiconductor chips, are mounted onto packaging substrates to form modules. In high performance computer applications, these modules contain a plurality of integrated circuits. A plurality of modules are mounted onto a second level of packages such as a printed circuit board or card. The cards arc inserted in a frame to form a computer.

In nearly all conventional interconnection packages except for double sided cards, signals from one chip on the package travel in a two dimensional wiring net to the edge of the package then travel across a card or a board or even travel along cables before they reach the next package containing the destination integrated circuit chip. Therefore, signals must travel off of one module onto wiring on a board or onto wiring on a cable to a second module and from the second module to the destination integrated circuit chip fn the module. This results in long package time delays and increases the wireability requirement of the two dimensional wiring arrays.

An improvement in interchip propagation time and increase in real chip packaging density can be achieved if three dimensional wiring between closely spaced planes of chips could be achieved.

U.S. patent application Ser. No. 5,099,309 describes a three dimensional semiconductor chip packaging structure which comprises a plurality of stacked cards. Each card is specially fabricated to have cavities on both sides thereof which contain chips. On each surface of the card, there are electrical conductors which are bonded by wires to contact locations on the chips. Electrical conductors extend through the cards between the chip containing regions and to contact locations on each side of the card. These contact locations have dendrites on the surface. The cards are stacked so that the dendrite covered contact locations on adjacent sides of adjacent cards intermesh to provide electrical interconnection between the adjacent cards. This structure requires a high degree board flatness for the connections to be mated.

SUMMARY OF THE INVENTION

It is an object of the present invention to provide improved three dimensional integrated circuit packaging structures.

Another object of the present invention is to provide such a packaging structures with both horizontal electrical interconnections and compliant vertical electrical interconnections.

A further object of the present invention is to provide such structures which can be assembled and disassembled into a plurality of subassemblies.

An additional object of the present invention is to provide such structures which have a high thermal dissipation capacity.

Yet another object of the present invention is to provide such structures which does not require rigid electrical interconnection between subassemblies.

Yet a further object of the present invention is to provide such structures which can be fabricated using conventional packaging substrates.

A broad aspect of the present invention is a structure having a plurality of assemblies. Each of the assemblies is formed from a substrate having a first and second opposing surfaces. There are a plurality of electronic devices disposed on at least one of the first and second surface of the substrate of each assembly. Each of the plurality of assemblies is disposed adjacent another of the plurality of assemblies so that the first surface of one of the adjacent assemblies is adjacent the second surface of the other of the adjacent assemblies. An electrical interconnection means is disposed between the first and second surfaces of the adjacent assemblies and provides electrical interconnection between contact locations on the adjacent surfaces. The electrical interconnection means is formed from a dielectric material having first and second opposing surfaces and a plurality of electrical contact locations on each surface which are electrically interconnected by a plurality of electrical conductors extending from the first surface to the second surface of the electrical interconnection means.

In a more particular aspect of the present invention, the substrates of the assemblies are formed from a diamond like material which has high thermal dissipation capacity.

In another more particular aspect of the present invention, the substrates have a plurality of dielectric and electrically conducting layers.

In another more particular aspect of the present invention, a heat dissipation means dissipates heat generated in the structure.

BRIEF DESCRIPTION OF THE DRAWINGS

These and other objects, features and advantages of the present invention will become apparent upon further consideration of the following detailed description of the invention when read in conjunction with the figures, in which.

DETAILED DESCRIPTION

Figure 1:
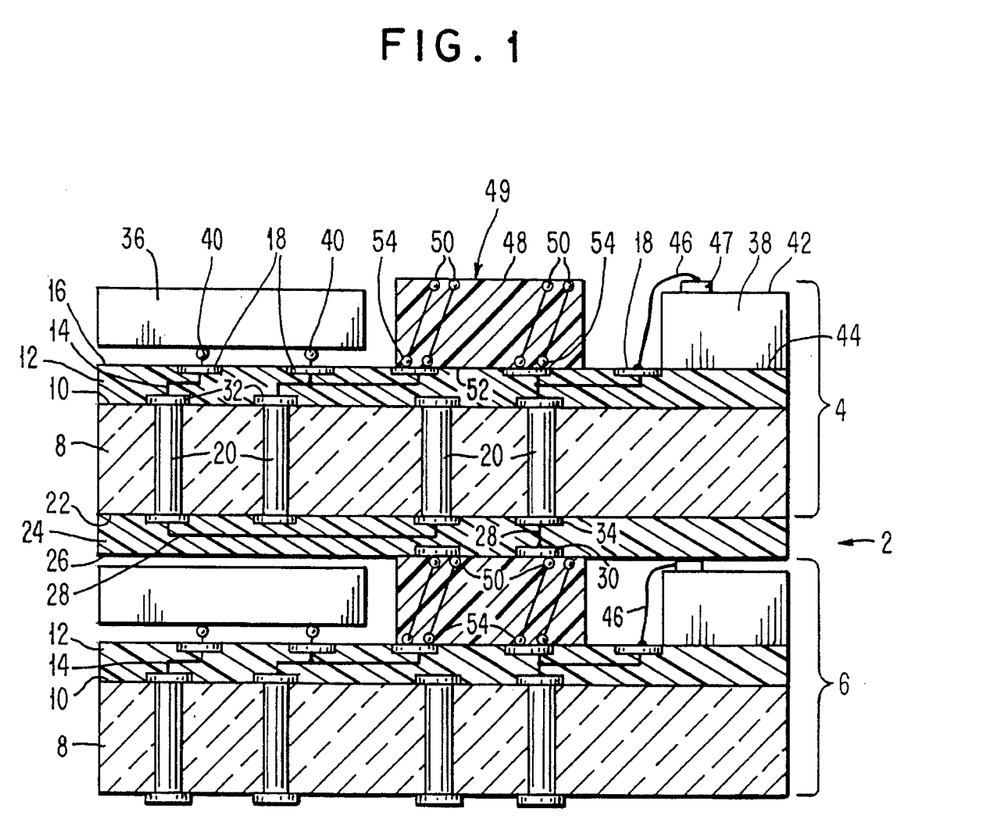
FIG. 1 shows a side view of a three dimensional electronic device packaging structure according to the present invention.

FIG. 1 shows structure 2 according to the present invention having two subcomponent assemblies 4 and 6. Structure 2 can have any number of subcomponent assemblies. Each subcomponent assembly is formed from a substrate 8 having a surface 10 which has a multilevel wiring structure 12 formed thereon. Multilevel wiring structure 12 is formed from a dielectric material, such as an oxide, a glass, a polymer and a ceramic, most preferably a polyimide polymer. Multilevel wiring structure 12 contains at least one layer of electrical conductors 14, such as copper, aluminum and gold, and has on surface 16 a plurality of contact locations 18. Substrate 8 is shown in FIG. 1 as having vias 20 extending from surface 10 to surface 22. Surface 22 has a multilayer wiring structure 24 which is similar to multilayer wiring structure 12. Surface 26 of multilayer wiring structure 24 contains at least one electrically conductive layer 28 which is preferably copper, the dielectric material being preferably polyimide. Surface 26 has a plurality of electrical contact locations 30 which are preferably copper coated with gold. Electrical contact layers 18 are also preferably copper with a top coating of gold.

Substrate 8 can be any commonly used multilayered packaging substrate containing a plurality of electrical conductors or glass ceramic and is preferably a highly thermally conductive material such as synthetic diamond, aluminum nitride ceramic, silicon a metal (such as copper) with an electrically insulating coating. Substrate 8 preferably has electrically conductive studs or vias 20 or through holes with a sidewall plated with an electrical conductor, such as copper, palladium, platinum and gold, as is commonly known in the art.

The electrical conductors in multilayer structures 12 on surface 10 of substrate 8 are electrically interconnected to contact locations 32 which are connected to via or stud 20 in substrate 8. Electrical conductors 28 in multilayer structure 24 on surface 22 of substrate 8 are electrically interconnected to contact locations 34 which are electrically interconnected to vias or studs 20 in substrate 8. Contact locations 32 and 34 are preferably formed from copper having a top surface gold.

A plurality of electronic devices 36 and 38, such as integrated circuit chips, preferably semiconductor chips, are mounted onto surface 16 of multilayer wiring structure 12.

Electronic device 36 is mounted in a flip-chip-configuration onto surface 16 with solder mounds 40, commonly known as C4s, electrically interconnecting the electronic device 36 to the contact locations 18.

Electronic device 38 is mounted with active face 42 facing upwards and its nonactive face 44 in contact with surface 16 of multilayer structure 12. Alternatively, for better thermal contact to substrate 8, device 38 may be mounted directly with its nonactive face 44 in contact with surface 10 of substrate 8. This is accomplished by removing a section of multilayer structure 12. Wires 46 commonly made of aluminum or gold are bonded between contact location 18 and contact location 47 on surface 42 of electronic device 38. Wires 46 are bonded by commonly known wire bonding techniques, ultrasonic bonding techniques, laser bonding techniques and the like.

Disposed between electronic devices 36 and 38 there is an electrical interconnection means 49 details of which will be described hereinbelow.

The electrical interconnection means 49 has a top surface 48 having contact locations 50 and a bottom surface 52 having contact locations 54. Contact locations 54 are in electrical interconnection with contact locations 18 between chips 36 and 38. Contact locations 50 are in electrical interconnection with contact locations 30 on surface 26 of multilayer structure 24.

Figure 2:
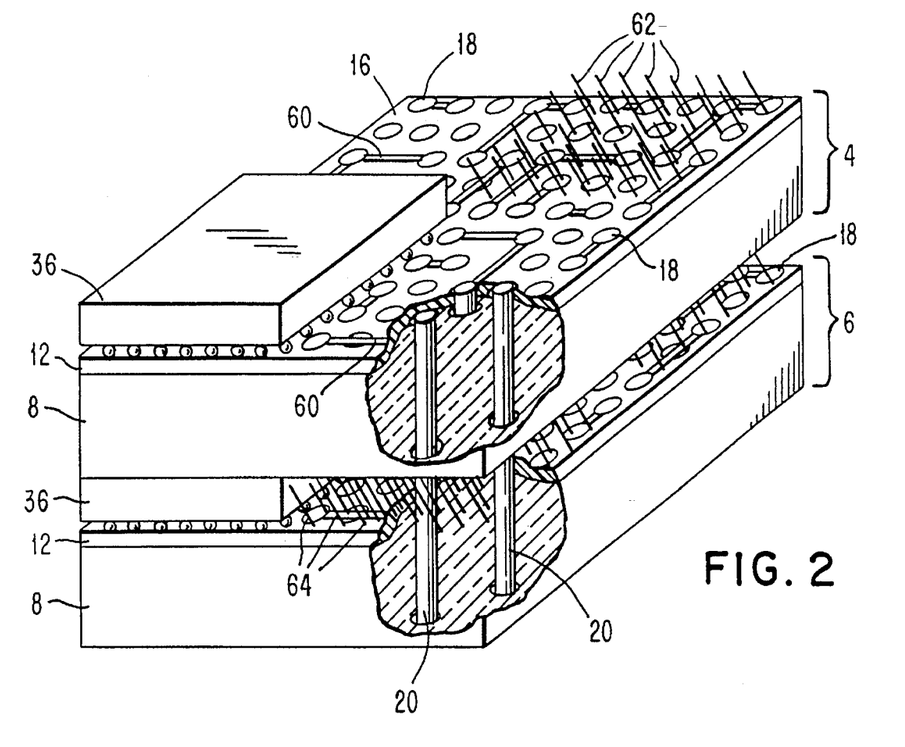
FIG. 2 shows a partial perspective view of the structure of FIG. 1.

FIG. 2 shows a partial view of the structure of FIG. 1 in perspective with a region of the right forward most corner of each substrate 8 partially cut away to reveal vias or studs 20. On surface 16, there is seen contact locations 18 and electrical conductors 60 which electrically interconnect some of the contact locations 18. The electrical interconnection means 49 is shown only partially as a plurality of electrical conductors 62 and 64. The electrical interconnection means will be described in greater detail hereinbelow.

Figure 3:
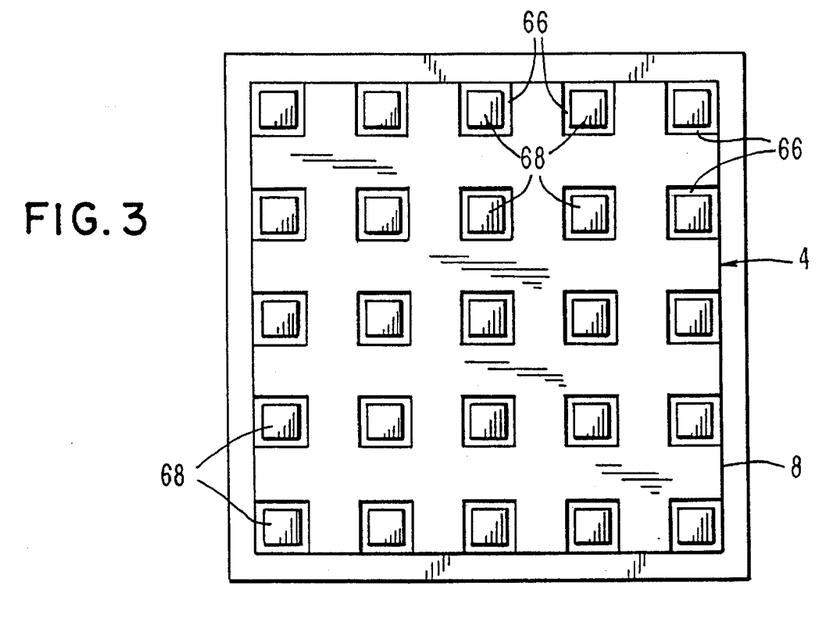
FIG. 3 shows a top view of the electrical interconnection means of the structure of FIG. 1.

FIG. 3 shows a top view of one of the subcomponent assemblies 4 or 6 of FIG. 1 showing the electrical interconnection means 49 having a plurality of apertures 66. The apertures 66 are adapted to receive a plurality of electronic devices 68 which are disposed on surface 16 of multilevel wiring structure 12 of FIG. 1. Numbers common between FIGS. 1, 2 and 3 represent the same thing.

Figure 4:
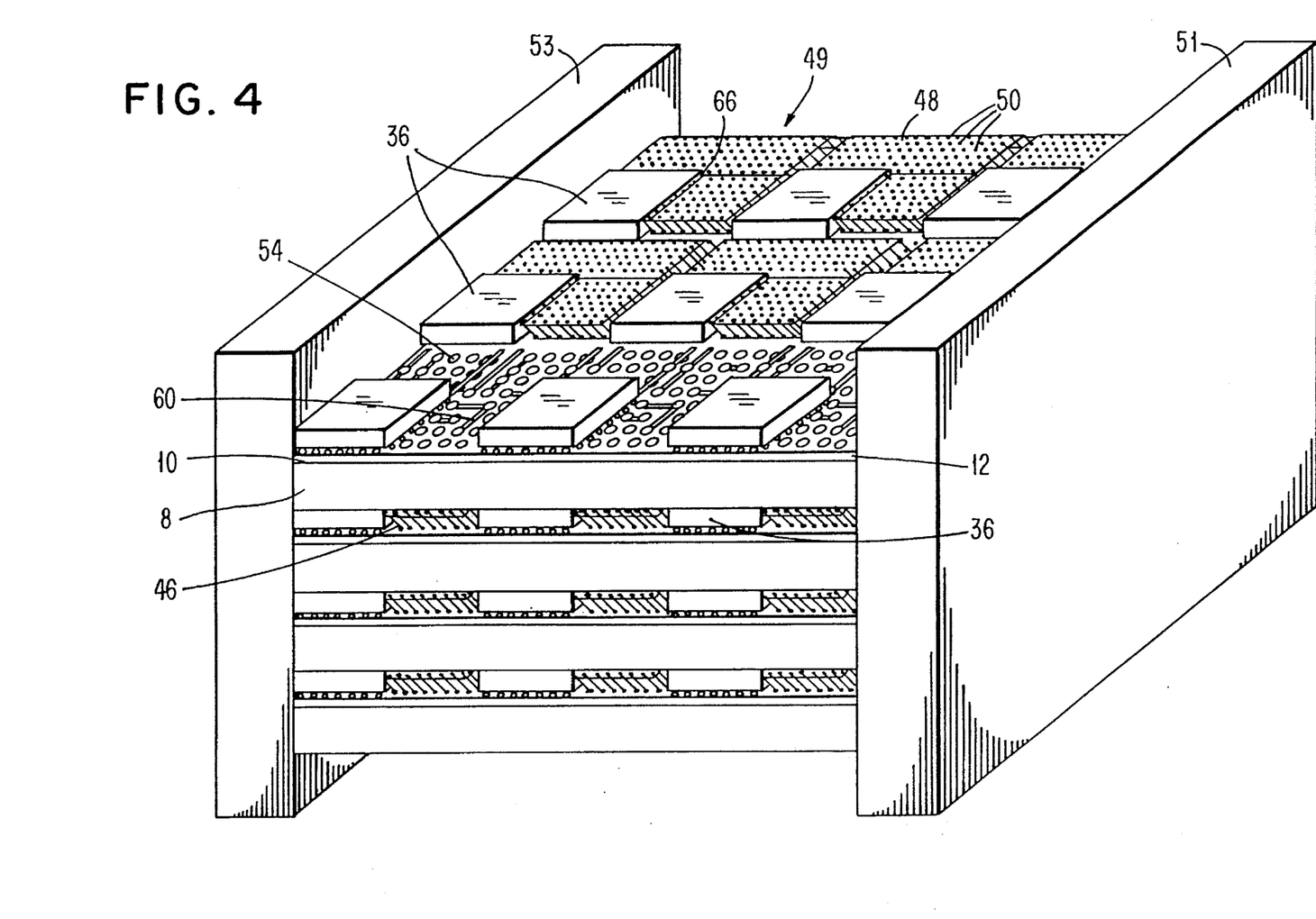
FIG. 4 shows a perspective view of the structures of FIG. 1 including a heat dissipation means.

FIG. 4 shows a perspective view of the structure shown in FIG. 1 plus heat dissipation means 51 and 53. Numbers common between FIGS. 1, 2, 3 and 4 represent the same thing. Heat dissipation means 51 and 53 are in thermal contact with substrates 8. The heat dissipation means is preferably made of aluminum. Substrate 8 is held in grooves in heat dissipation means 51 and 53 to ensure good thermal contact, mechanical support and compresses the interconnection means 49 between adjacent assemblies to provide electrical interconnection therebetween as described herein below. Heat dissipation means 51 and 53 are held in a support frame (not shown).

The thin film wiring layers 12 and 14 of FIG. 1 preferably contain at least one plain pair (XY) of wiring and two reference planes which provide power and ground to the electronic devices 36 and 38. If the electronic devices are bipolar chips there are preferably two additional power planes. The dimensions of the wiring and the thickness of the reference planes depends on the specific application and it can vary from 8 micron wide lines, 5 micron thick, on a 25 micron pitch to 25 micron wide lines, 25 microns thick on a pitch of 75 micron or more. The thickness of the insulation in the thin film wiring layers 12 and 24 is adjusted to provide the required transmission line impedance that is typically in the range of 4 to 80 ohms.

The electrical interconnection means 49 is formed to occupy the space between the chips as shown in FIGS. 1–4.

The structure of FIG. 1 is compressed from the top and bottom of the structure to compress the electrical interconnection means 46 between the adjacent assemblies pressing electrical contact locations 30 on substrate 8 in contact with electrical contact locations 50 on electrical interconnection means 49 and pressing electrical contact locations 54 on electrical interconnection means 49 in contact with electrical contact locations 18 on the surface of the thin film wiring layer 12. Thus, a signal from any one chip will travel in the thin film wiring layer and vertically through the electrical interconnection wiring means 49 to any thin film wiring plane in the stack of substrates 8 and thus along the shortest path to any chip in the entire structure 2. If a single plane contained 25 chips, for example, as shown in FIG. 3, each being 1 centimeter square, then the electrical interconnection means 46 would occupy the 1 centimeter space between each chip. With this design point the vias in the substrates 8 and the connections in the electrical interconnection means 49 could be made on a 36 mil square grid with 20 mil wide pads 18 on the substrate 8. There would be approximately 6,694 vertical signal connections possible on one plane. The grid could be reduced by a factor of approximately 2 if required and 26,000 vertical connections could be made.

The overall high performance package can consist of as many insulating plates populated by chips as required. The heat would be conducted to the edges of the high thermal conductivity substrates 8 where it would be carried away by air or water cooled or the like heat sinks as appropriate and commonly known in the art.

The substrates are preferably made of a high thermally conductive insulating material made of commercial diamond (manufactured For example by NORTON Inc. and Diamonex Inc.) which can be laser drilled to form vias and metallized for through hole connections using standard processing such as the process used on diamond heat spreaders for diode lasers. The very high thermal conductivity of diamond (1500 W/m°K.) makes it the most desirable material in this structure and would allow the cooling of more than 100 watts per plane. Other materials are useful. A lower cost alternative would be AnN ceramic with co-sintered solid vias, which are commercially available or silicon wafers which can contain laser drilled holes or chemically etched through vias. The thin film wiring layer 12 and 24 preferably contains copper wiring in a polyimide dielectric and can be fabricated by standard sequential thin film processes directly onto substrate 8 as described in R. Tummala and E. Rymasizewski, Microelectronics Packaging Handbook, Van Nostrand, Rienhold, N.Y., 1989 Chapter 9, the teaching of which is incorporated herein by reference. The thin film wiring structure can be fabricated separately by the serial/parallel thin film wiring process and joined to the substrates 8 as described in U.S. patent application Ser. No. 07/695,368, filed May 3, 1991, now U.S. Pat. No. 5,258,236 the teaching of which is incorporated herein by reference. In the serial/parallel processes the thin film wiring structures are fabricated on separate carriers then transferred and laminated to the insulated plates preferably by thermal compression bonding. The electrical interconnection means 49 preferably contains gold wires held at a slight angle in an elastomeric matrix. Other embodiments of large area array connectors can also work. The electrical interconnection means 49 using an elastomeric matrix has desirable properties such as lower resistance, low contact force, wipe, and low inductance which makes it particularly desirable in this application. The electrical interconnection means 49 can be fabricated to be approximately 1 millimeter thick with 10 percent compliance.

The substrates 8 are made with conducting vias. Top and bottom surface pads are applied by standard techniques such as evaporation of metals through a metal mask as described in Tiemmala et al., chapter 9 above. The electronic devices 36 and 38 are joined to each thin film wiring layer after the electronic devices are tested and burned in. The electrical interconnection means 49 are fabricated separately and tested. Finally, the stack of assemblies with electronic devices mounted onto the substrates with the electrical interconnection means 49 disposed thereon are aligned and a compressive force is applied to make the interconnections. The force is preferably from 10 to 50 grams per contact or from 70 to 300 kilograms for the entire package. The connection is separable.

FIGS. 5–21 show the method for fabricating electrical interconnection means 49 of FIG. 1 and show various embodiments and fabrication techniques of this electrical interconnection means.

Figure 5:
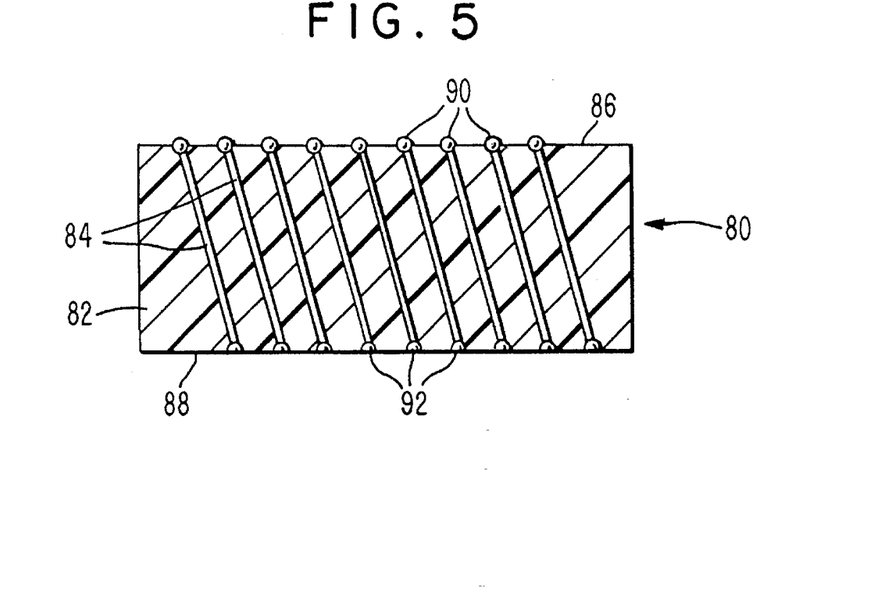
FIG. 5 shows a cross sectional view of a section of the electrical interconnection means of the structure of FIG. 1.

FIG. 5 shows electrical interconnection means 80 which corresponds to electrical interconnection means 49 of FIG. 1. The electrical interconnection means 80 is formed from an elastomeric material 82 having a plurality of electrical conductors 84 extending from side 86 to side 88 thereof. Each conductor 84 preferably has a generally spherical end 90 at side 86 and a flattened spherical shape 92 at side 88. The conductors 84 are preferably gold, gold alloy or copper alloy. The size, shape and the spacing of wires 84 along with the material properties of the elastomeric material 82 can be modified to optimize the connector for a specific application.

Figure 6:
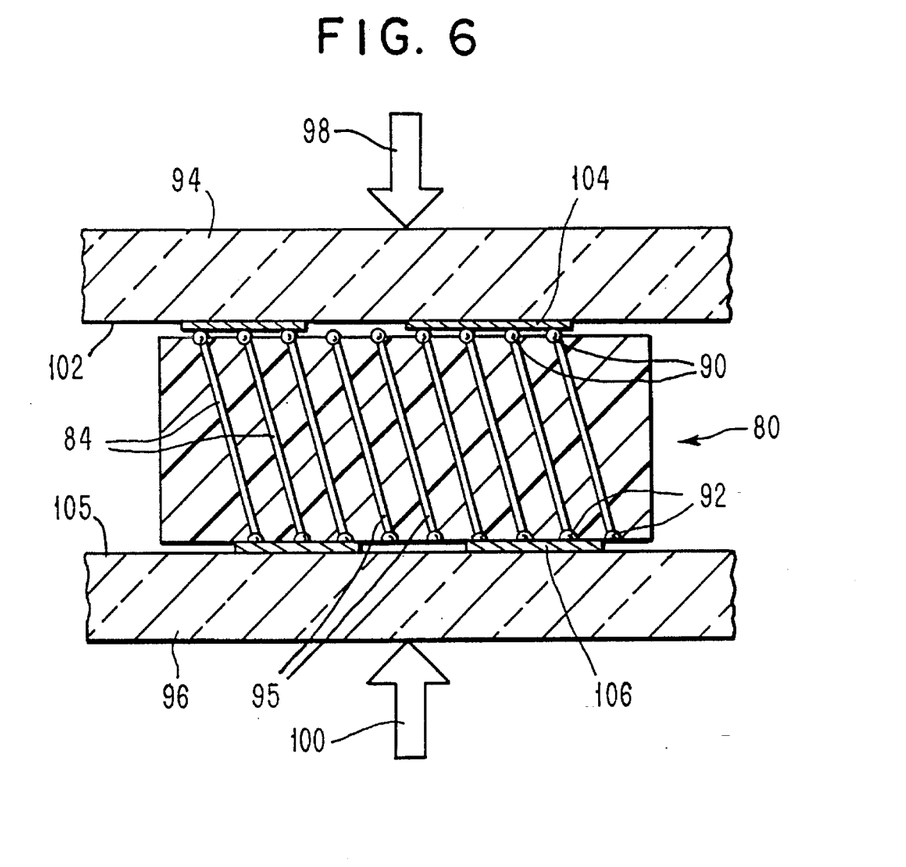
FIG. 6 shows the structure of FIG. 5 disposed under pressure between two adjacent substrates.

FIG. 6 shows substrate 94 and 96 pressed towards each other as indicated by arrows 98 and 100 with interposer 80 therebetween. The elastomer 82 acts as a spring to push the enlarged end contact surfaces 90 and 92 against mating contacts 104 and 106 on substrates 94 and 96 respectively. Surface 102 of substrate 94 has contact locations 104 which are typically metalized pad. Substrate 96 has contact locations 106 which are also typically metallized pads. When substrate 94 is pressed towards substrate 96 the ends 90 and 92 move laterally with respect to the contact surface because conductors 84 are at a nonorthogonal angle with respect thereto. This lateral movement results in a wiping action which breaks a surface oxide which is on the surface of the contact locations 104 and 106 and which is on the surface of the enlarged ends 90 and 92. The wiping action makes a good electrical contact between the enlarged surface 90 and 92 and the contact locations 104 and 106, respectively.

The advantages and unique features of the electrical interconnection means 80 are that it provides uniform spacing of the electrical conductors 84 and the elastomer material on, for example, a 0.008 inch minimum pitch using a single wire per contact. The enlarged ball shaped contacts 90 protrude from top side 86 of interconnection means 80 and the enlarged, flattened contacts 92 are generally flush with the bottom surface 88 of interconnection means 80. Textured or raised contact surface can be formed on the bottom side of the contact 92 to enhance the contact interface to an electrical contact location on substrate 96. The wires 84 in the elastomer material 82 can be grouped into small clusters to provide redundant connections for each contact location 104 or 106. If clustered wires are used, wires 95 in interconnect structure 80 of FIG. 6 would be eliminated.

Figure 7:
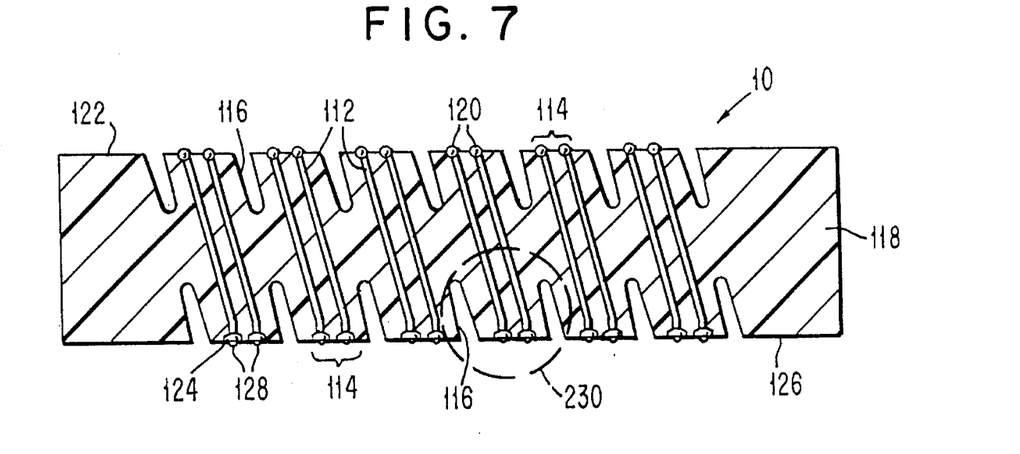
FIG. 7 shows another embodiment of the structure of FIG. 5 having grooves on the two opposing surfaces.

FIG. 7 shows a cross section of another embodiment 110 corresponding to the electrical interconnection means 49 of FIG. 1. Structure 110 has electrical conductors 112 which are clustered into groups 114. Between each group there are grooves 116. The elastomer material 118 is preferably a silicone elastomer and there are ball shaped contacts 120 on side 122 and flat contact 124 on side 126 having a raised surface 128. The top and bottom wire shapes can be varied for optimization. The alignment grooves 116 of structure 110 can be formed using a laser, electron beam or other sensing techniques as described in U.S. Pat. No. 4,998,885, to Beaman, the teaching of which is incorporated herein by reference.

Alignment features 116 can be molded into the elastomer material to allow accurate alignment of the conductors 112 in the structure 110 with contact locations 104 and 106 on surfaces 102 and 105, respectively, as shown in FIG. 6. An alignment mechanism is preferred to enhance accurate positioning of the interposer wires with the contacts on the adjacent substrates. The molded alignment features can also be used to control the shrinkage and distortion of the contact grid in the elastomer material. Mechanically or thermally induced stress in the elastomer material can cause the interposer to distort causing alignment problems with the mating contacts.

Figure 8:
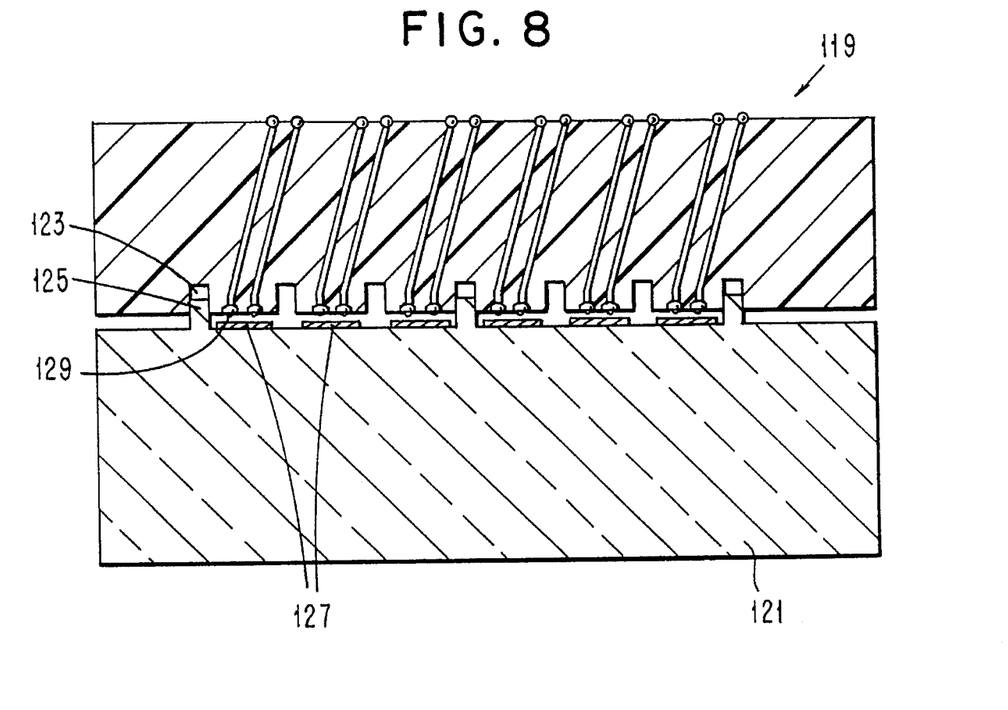
FIG. 8 shows grooves on an interposer engaging projections on a substrate to align substrate and interposer contact locations.
Figure 10:
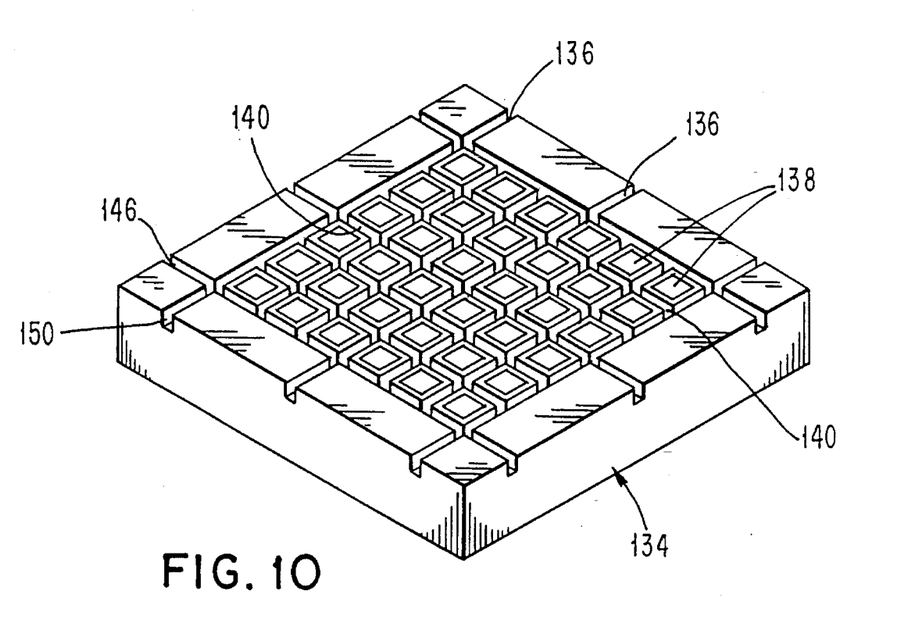
FIG. 10 shows an interconnection structure having grooves for mating with the frame of FIG. 9.

The electrical interconnection means shown in FIGS. 5, 7 and 8 and electrical interconnection means 49 of FIG. 1 will also be referred to herein as an ELASTICON interposer. The ELASTICON interposer is designed to provide signal and power connections from the bottom surface of a substrate to another substrate. The ELASTICON interposer can be fabricated to have a full array of conductors or a clustered array of conductors. The interposer connector that uses a full array of conductors (or wires) would typically not require alignment of the connector to the contact locations on the substrates between which is disposed. By using clusters of wires, overall fewer wires are used to fabricate the interposer. This is useful for reducing the cost of the connector and the pressure required to ensure full engagement of the contacts. Interposer contacts that use a clustered array of wires preferably have a means for aligning the wire clusters with the remaining said contacts. An interposer having a cluster set of wires minimizes the number of wires required during the interposer fabrication and enhances the compliance of the connector assembly. The molded or scribed grooves or other features in the elastomer material can be used to allow the interposer connector to self align with similar features on the substrates between which it is disposed as shown in FIG. 8. FIG. 8 shows interpfser 119 disposed on substrate 121. Interposer 119 has grooves 123 which mate with projections 125 on substrate 121 which aligns substrate pads 127 to interposer contact locations 129. These alignment features can be designed using a variety of simple geometric shapes such as circular post, rectangular ridges, or a raised grid pattern. FIG. 10 shows a perspective view of an ELASTICON interposer useful as the electrical interconnection means 49 of FIG. 1. The ELASTICON interposer 134 of FIG. 10 has a plurality of alignment grooves 136 and regions 138 containing clustered contacts wherein each region is surrounded by grooves 140.

Figure 9:
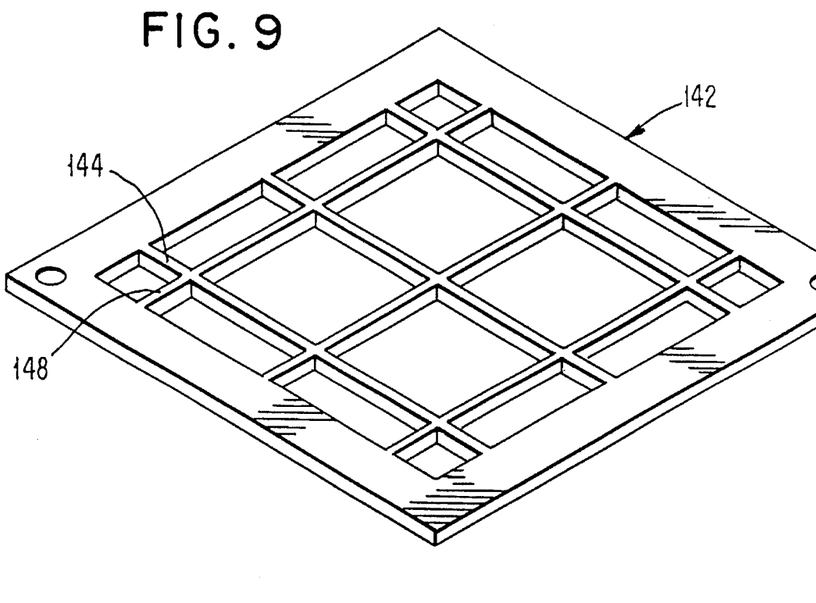
FIG. 9 shows an alignment frame for mating with alignment grooves such as shown in the structure of FIG. 10.

FIG. 9 shows an alignment frame 142 which is adapted for engagement with the grooves on the interposer 134 of FIG. 10 to align substrate contact locations to interposer contact locations. For example, bar 144 in alignment frame 142 engages groove 146 of structure 134 of FIG. 10 and bar 148 of frame 142 engages groove 150 of structure 134 of FIG. 10. The frame is disposed on a substrate having contact locations to which interposer contact locations are to be aligned.

An overall alignment scheme is preferred to fabricate the structure of FIG. 1. Each of the disconnectable elements of the module preferably have a means of alignment to the other elements in the module. A separate alignment frame could be attached to each substrate similar to the one used for the interposer.

FIGS. 11–19 show a fabrication method for the ELASTICON interposers described herein.

Figure 11:
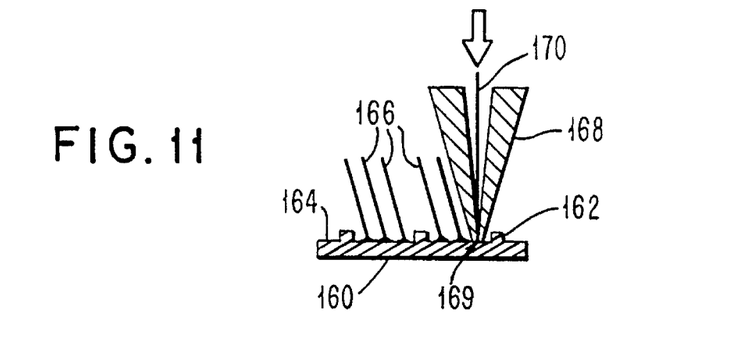
FIGS. 11–19 show the process for making the electrical interconnection means, for example, of FIG. 5.

The fabrication process starts with a sacrificial substrate 160, which is preferably copper, copper/Invar/copper or copper/molybdenum copper. Materials other than copper can be used such as aluminum, hard plastic or steel. The substrate 160 can be fabricated to have protuberances 162 which provide the grooves 116 in the ELASTICON interposers of FIG. 7. The protuberances 162 can be formed using various fabrication techniques including machining of the surface 164 or stamping of the surface 164. After the substrate has been formed with the protuberances, the top surface 164 is sputtered or plated with soft gold or Ni/Au to provide a suitable surface for thermosonic ball bonding. Other bonding techniques can be used such as thermal compression bonding, ultrasonic bonding, laser bonding and the like. A commonly used automatic wire bonder is modified to ball bond gold, gold alloy, copper, copper alloy, aluminum, nickel or palladium wires 166 to the subtrate surface 164 as shown in FIG. 11. The wire preferably has a diameter of 0.001 to 0.005 inches. If a metal other than Au is used, a thin passivation metal such as Au, Cr, Co, Ni or Pd can be coated over the wire by means of electroplating, or electroless plating, sputtering, e-beam evaporation or any other coating techniques known in the industry. Structure 168 of FIG. 11 is the ball bonding head which has a wire 170 being fed from a reservoir of wire as in a conventional wire bonding apparatus. FIG. 11 shows the ball bond head 168 in contact at location 169 with surface 164 of substrate 160.

Figure 12:
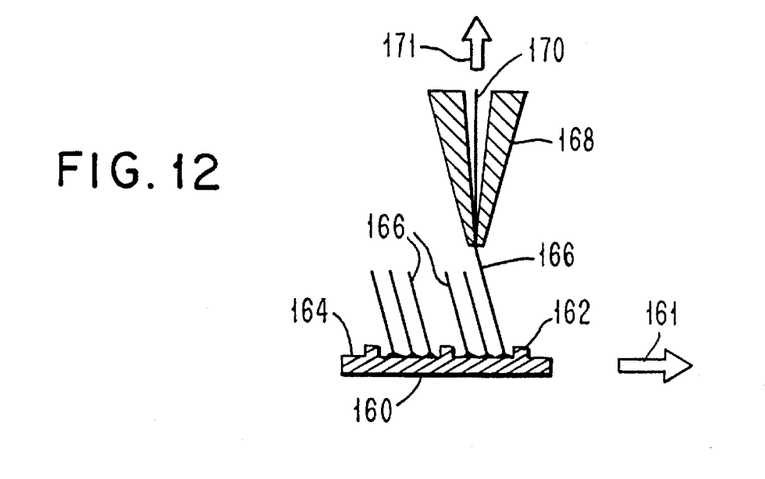
Figure 13:
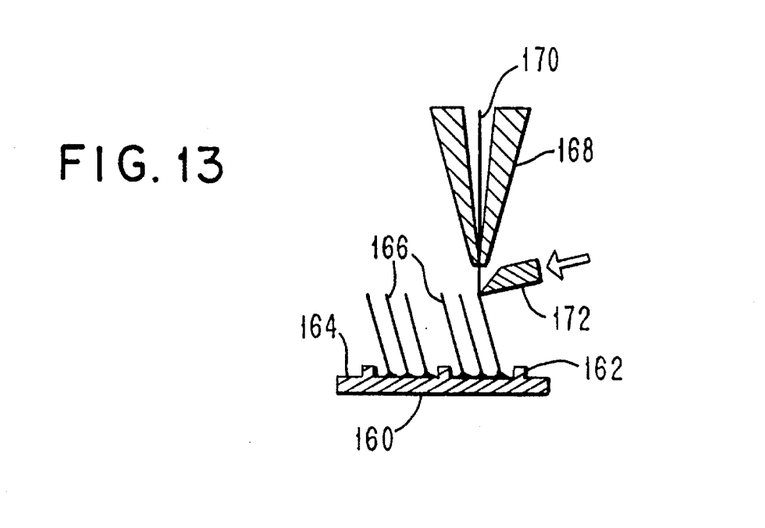

FIG. 12 shows the ball bonding head 168 withdrawn in the direction indicated by arrow 171 from the surface 164 and the wire 170 drawn out to leave disposed on the surface 164 wire 166. In the preferred embodiment, the bond head 168 is stationary and the substrate 160 is advanced as indicated by arrow 161. The bond wire is positioned at an angle preferably between 5° to 60° from vertical and then mechanically severed by knife edge 172 as shown in FIG. 13. The knife edge 172 is actuated, the wire 170 is clamped and the bond head 168 is raised. When the wire 170 is severed there is left on the surface 164 of substrate 160 a flying lead 166 which is bonded to surface 164 at one end and the other end projects outwardly away from the surface. A ball can be Formed on the end of the wire 166 which is not bonded to surface 164 using a laser or electrical discharge to melt the end of the wire. Techniques for this are commonly known in the art. A split beam laser delivery systems, described hereinbelow, is used to localize the laser energy to a single wire for forming the ball. This minimizes the laser energy absorbed by adjacent wires that could cause the wires to deform. A ball is not required on the end of the wire. This modified wire bonding process is repeated to form a dense array of angled wires on the substrate.

Figure 14:
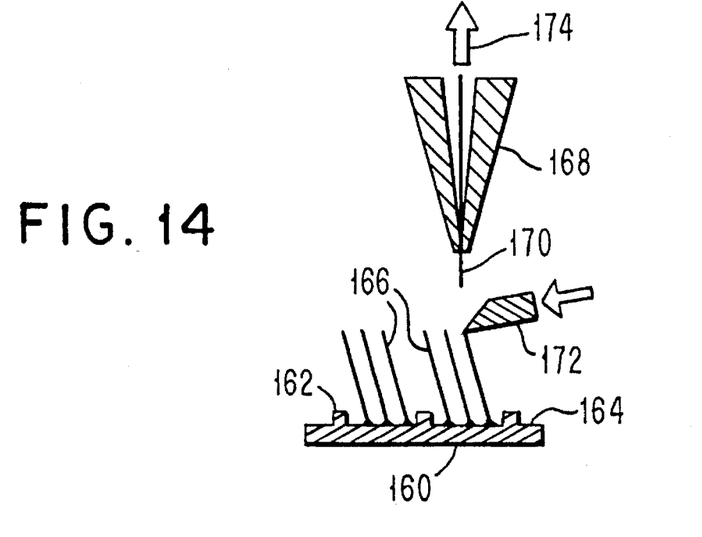

FIG. 14 shows the wire 170 severed to leave wire 166 disposed on surface 164 of substrate 160. The wire bond head 168 is retracted upwardly as indicated by arrow 174. The wire bond head 168 has a mechanism to grip and release wire 170 so that wire 170 can be tensioned against the shear blade to sever the wire.

Figure 15:
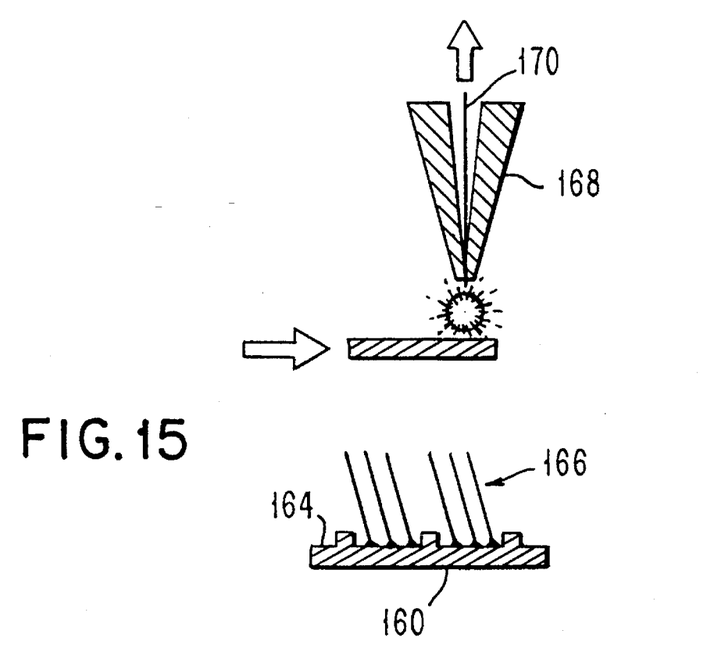

FIG. 15 shows that after the wire is severed, the bond head is raised to a "home" position. An electronic flame off unit (part of Hughes Wire Bonder, Modec III-2640) electrode is positioned below the bond head and an electrical discharge from the electrode is used to melt the wire in the capillary tip to form a ball.

Figure 16:
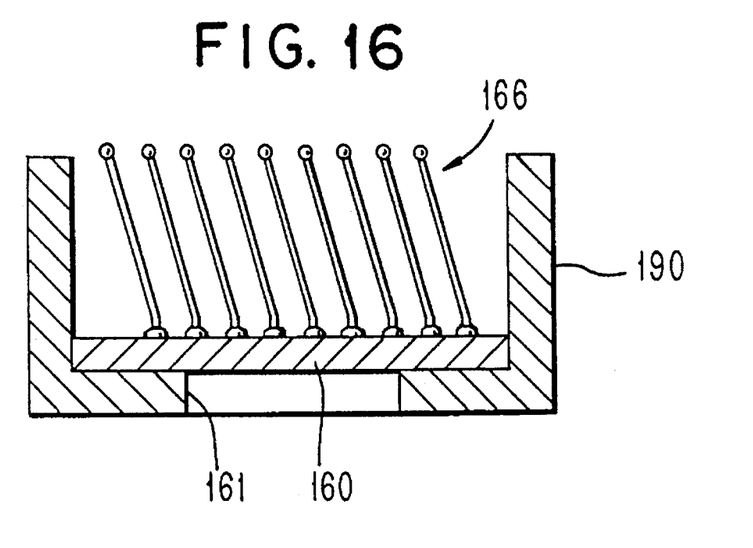
Figure 17:
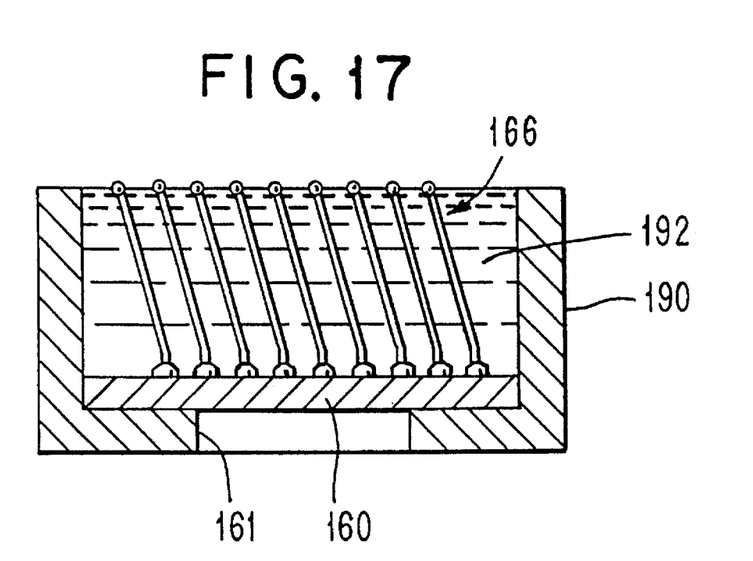
Figure 18:
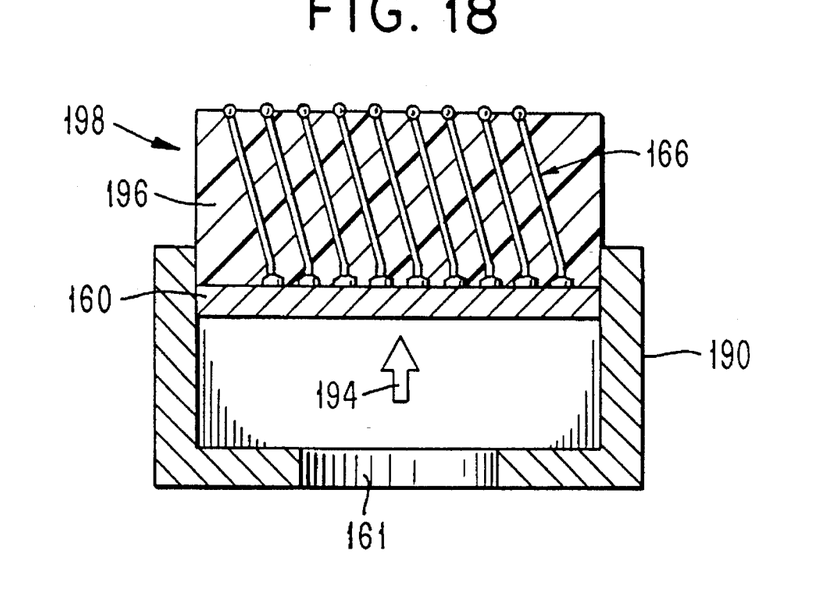
Figure 19:
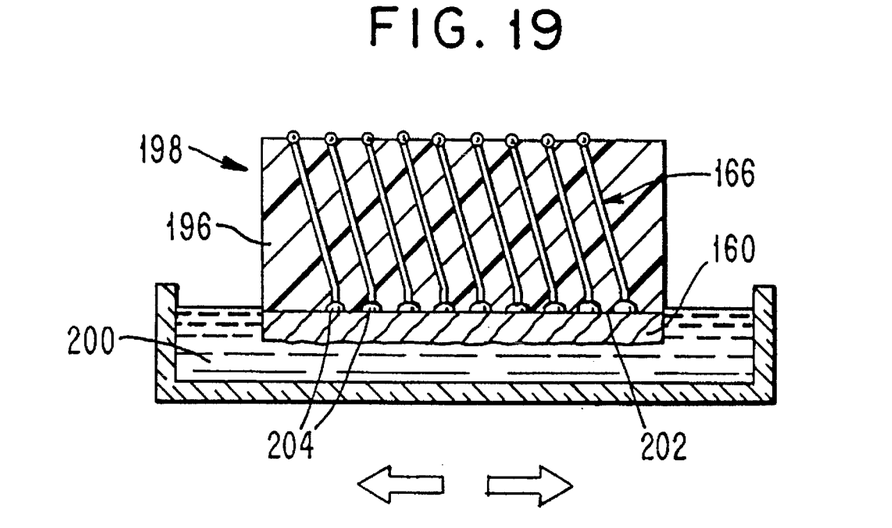

After the wire bonding process is completed, the substrate 160 is placed in a casting mold 190 as shown in FIG. 16. A controlled volume of liquid elastomer 192 is disposed into the casting mold and allowed to settle out (flow between the wires until the surface is level) before curing as shown in FIG. 17. Once the elastomer has cured, the substrate is extracted from the mold as shown in FIG. 18 and indicated by arrow 194. The cured elastomer is represented by reference rule 196. Opening 161 in mold 190 is a tooling feature for extracting the substrate from the mold. The structure 198 is removed from the mold 190 and is placed in a sulfuric and nitric acid bath 200, as shown in FIG. 19 to dissolve the copper substrate 160. Ultrasonic agitation of the sulfuric and nitric acid helps to facilitate the etching of the copper substrate and causes the gold plating on the surface of the copper substrate to flake off from the surface 202 of the elastomer material 196 leaving the surface of the ball bonds 204 exposed.

Alternatively, the substrate can be made of peel-apart-copper, where a thin layer of copper is attached to a solid substrate with a marginal adhesion strength. After the fabrication is completed, the connector can be peeled off from the sacrificial substrate before the remaining thin copper is flash etched away.

A high compliance, high thermal stability siloxane elastomer material is preferable for this application. The high temperature siloxane material is cast or injected and cured similar to other elastomeric materials. To minimize the shrinkage, the elastomer is preferably cured at lower temperature ($T \leq 60°$) followed by complete cure at higher temperatures ($T \geq 80°$). To further control the shrinkage, the connector is cast into a plastic frame, which was predrilled with holes around its periphery. When the elastomer is poured into this frame a physical locking of the elastomer to the frame takes place which both holds the elastomer/connector to the frame and minimizes the shrinkage. To improve the compliance and reduce the dielectric constant of the elastomer material, a foam agent can be blended into the commercial elastomeric material at a ratio ranging from 10 to 60%. Also, foam can be employed as a distinct layer.

Among the many commercially avaliable elastomers, such as ECCOSIL and SYLGARD, the use of polydimethylsiloxane based rubbers best satisfy both the material and processing requirements. However, the thermal stability of such elastomers is limited at temperatures below 200° C. and significant outgassing is observed above 100° C. We have found that the thermal stability can be significantly enhanced by the incorporation of 25 wt % or more diphenylsiloxane (FIG. 1). Further, enhancement in the thermal stability has been demonstrated by increasing the molecular weight of the resins (oligomers) or minimizing the crosslink junction. The outgassing of the elastomers can be minimized at temperatures below 300° C. by first using a thermally transient catalyst in the resin synthesis and secondly subjecting the resin to a thin film distillation to remove low molecular weight side-products. For our experiments, we have found that 25 wt % diphenylsiloxane is optimal, balancing the desired thermal stability with the increased viscosity associated with diphenylsiloxane incorporation. The optimum number average molecular weight of the resin for maximum thermal stability was found to be between 18,000 and 35,000 g/mol. Higher molecular weights were difficult to cure and too viscous, once filled, to process. Network formation was achieved by a standard hydrosilylation polymerization using a hindered platinum catalyst in a reactive silicon oil carrier.

In FIG. 11 when bond head 168 bonds the wire 170 to the surface 164 of substrate 160 there is formed a flattened spherical end shown as 204 in FIG. 19. The protuberances 162 on substrate 160 as shown in FIG. 11 result in grooves in the elastomer such as grooves 116 shown in FIG. 7. These grooves form alignment features. The design and tolerances used to form the copper substrate 160 are preferably carefully matched with the design and tolerances used to fabricate the alignment features on the substrates 94 and 96 shown in FIG. 6. Alternatively, on a substantially flat substrate, an alignment frame, such as shown in FIG. 9, can be disposed on the surface of a substrate, such as 94 and 96, of FIG. 6 and the elasticon interposer with grooves can be disposed onto this alignment frame so that the alignment grooves of the interposei engage the frame pattern as describe herein above with respect to FIGS. 9 and 10.

Figure 20:
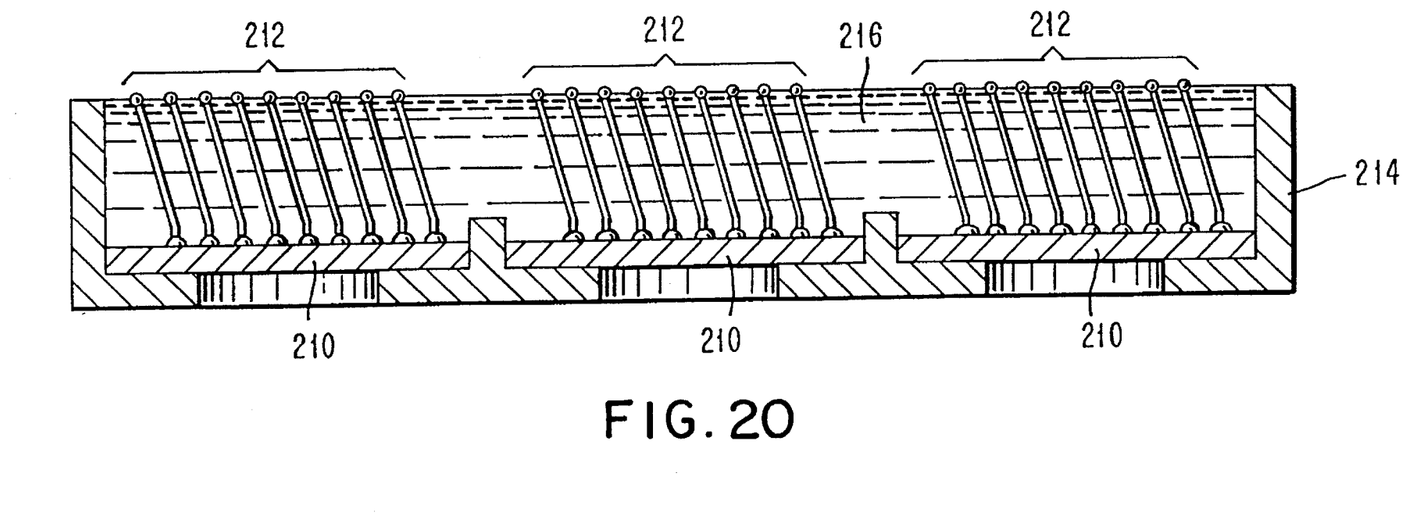
FIGS. 20 and 21 show an alternate embodiment of some of the method steps for fabricating an electrical interconnection means.
Figure 21:
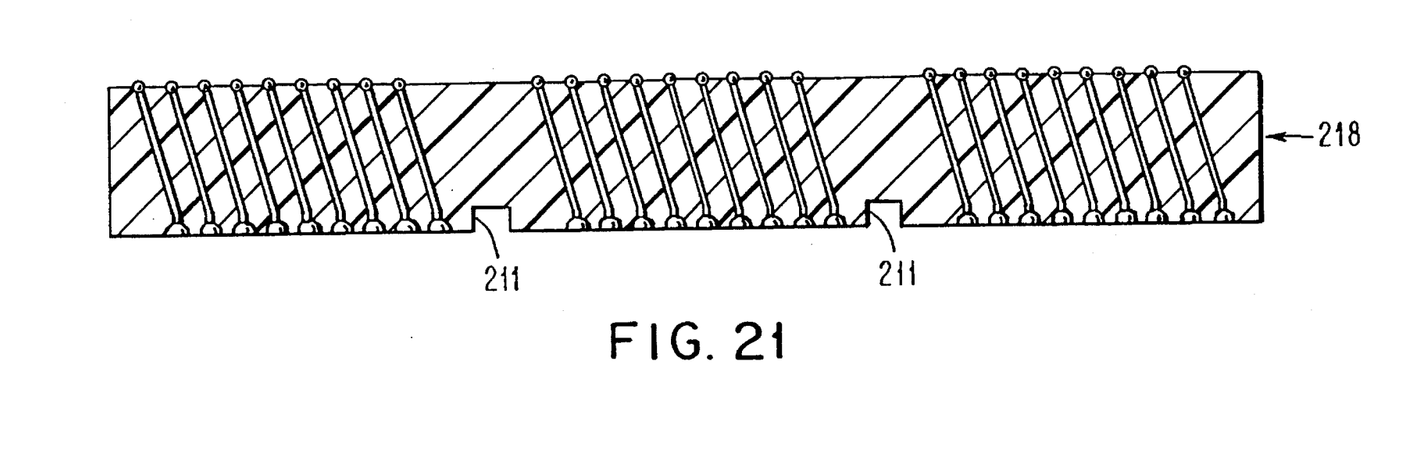

Referring to FIG. 20, multiple substrates 210 each having a group of wires 212 disposed thereon can be placed into a common mold 214 into which the liquid elastomer 216 as described herein above is disposed and cured. The cured elastomer links the substrates together into a single interposer 218 as shown in FIG. 21. Grooves 211 are for compliance or alignment requirements. Alternatively, several smaller connectors can be fabricated on the same substrate as a single unit and then separated after the elastomer is cured and the substrate is etched away.

Also, the surface of the copper sacrificial substrate can be textured or embossed prior to gold plating and wire bonding to provide a textured or raised contact surface on the bottom of the ball bonds. The completed interposer 218 of FIG. 21 can be further modified by using a laser to scribe channels in the elastomeric material between the bond wires at an angle matching the angle of the bond wires, as shown in FIG. 7. The criss-crossing channels create independent elastomeric columns (shown in FIG. 10 as 138) surrounding the gold wires. This would allow individual wires or groups of wires to compress independently and allow the interposer to compensate for slight variations in the remaining surfaces while reducing the total pressure required to compress the entire interposer. Patterned connectors can easily be fabricated by programming the wire bonder to a specific pattern and molding the elastomer to provide holes or open areas in the connector that correspond with other electronic or mechanical components surrounding the connector.

To improve compliance and reduce wire deformation, grooves are preferably molded into the elastomer on both sides of the connector surfaces in both the X and Y directions or in a circular geometry. The width and depth of the groove are preferably wider than 5 mils and deeper than 10 mils, respectively, in an interposer 100 mils thick. The grooves are preferably molded in a direction parallel to the angled wire.

Grooves have been fabricated with laser, electron beam, metal mask and slicing with a blade. Other techniques such as stamping, injection molding and other known techniques to create the desired geometry would also work well.

Figures 22, 23:
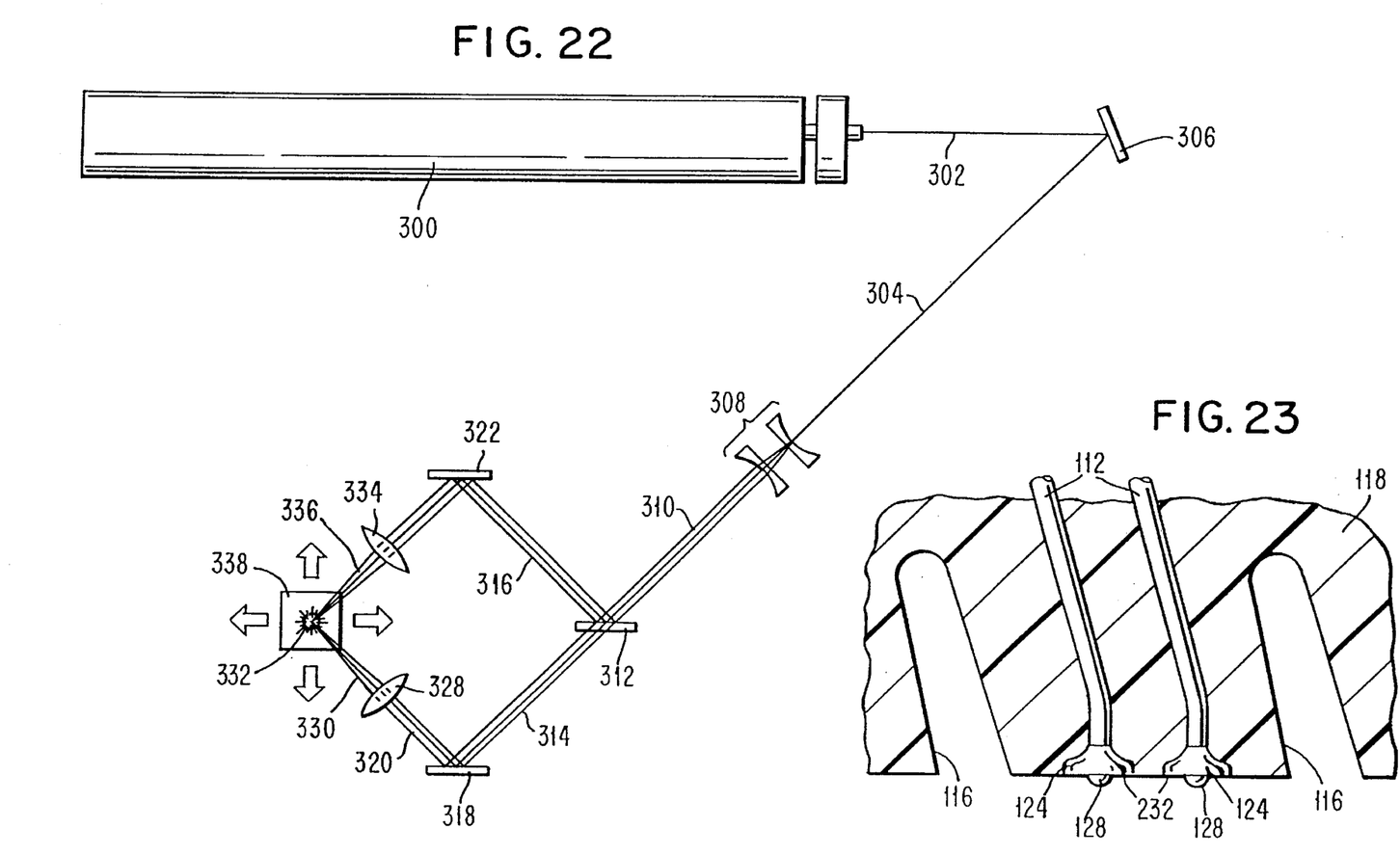
FIG. 22 schematically shows an optical system to form balls on the end of the wire conductors in FIG. 15.
FIG. 23 is an enlarged view of the region of FIG. 7 enclosed in dashed circle 230.

The contact balls at the end of the wires are formed using a split beam laser configuration. The end of each wire will melt and form the ball only at the point where the two beams intersect. The design is illustrated in FIG. 22 which shows light source 300, preferably an argon-ion laser which is the source of light beam 302 which is reflected as light beam 304 by mirror 306. Light beam 304 is directed through light beam expander 308 to form expanded light beam 310. Expanded light beam 310 is directed to beam splitter 312 which splits beam 310 into beams 314 and 316. Beam 316 is reflected off mirror 322 as light beam 324. Beam 314 is reflected off mirror 318 as light beam 320. Beam 320 is passed through focusing lens 328 to form focused beams 330 which focused onto spot 332 on the workpiece which is the end of a wire. Beam 324 is passed through focussing lens 334 to form focused beam 336 which is focussed onto spot 332 on the workpiece. The workpiece is disposed on x-y table 338. The beam is expanded before Focussing to get the desired size of spot 332.

FIG. 23 shows an enlarged view of the region of FIG. 7 enclosed in the dashed circle 230. Element 124 is a flattened ball shape member at the end of conductor 112. The flattened ball shaped member 124 was formed when conductor 112 was wire bonded to the sacrificial copper layer as described with reference to FIG. 11. The sacrificial copper layer can be fabricated with an array of pits in the surface in the regions where the wires 112 are bonded. These pits can have, for example, a hemispherical shape, rectangular shape, pyrimidal shape or any other shape. If such an array of pits are used and the wire is bonded in the region of the pit, a protuberance such as 128 of FIG. 22 is formed at the surface 232 of flattened ball. This protuberance provides a projecting region to the contact formed by flattened ball 124 which can wipe on the surface of the contact location to which the flattened ball is to be electrically connected.

While the present invention has been described with respect to preferred embodiments, numerous modifications, changes and improvements will occur to those skilled in the art without the departing from the spirit and scope of the invention.

What is claimed is:

1. A method comprising the steps of:

providing a substrate;

providing a plurality of elongated conductors each having a first end and a second end;

bonding said first end of each of said plurality of conductors to said substrate;

said second ends of said plurality of elongated conductors projects away from said substrate;

placing said substrate in a mold;

adding to said mold a liquid material;

curing said liquid to a solid body having said plurality of elongated conductors disposed therein and said substrate attached thereto;

removing said solid body from said mold;

removing said substrate from said solid body and from said first end of each of said plurality of said conductors, thereby leaving said solid body with said elongated conductors extending there through;

said first and said second ends of said elongated conductors being exposed at the surface of said solid body and said substrate has projections disposed there on to form cavities on said solid body during said curing step, said cavities being disposed to permit said elongated conductors to move relative to each other when said elongated conductors are pressed against a surface.

2. The method of claim 1, wherein said substrate is a laminated substrate formed from a material selected from the group consisting of Cu and laminated with one or more of molybdenum, invar and a composite thereof with a polymer layer.

3. The method of claim 1, each of said cavities in said solid body surround at least one of said elongated conductors.

4. The method of 3, wherein said projections are formed by stamping said substrate.

5. The method of claim 1, wherein said step of removing said substrate is etching said substrate.

6. The method of claim 1, including forming an enlargement at said second end of each of said plurality of elongated conductors.

7. The method of claim 1, further including forming an enlargement at said first end of each of said plurality of elongated conductors.

8. The method of claim 1, wherein said substrate is formed froth peel-apart-copper wherein a thin layer of copper is attached to a sacrificial substrate with a marginal adhesion strength and wherein said layer of copper is peeled off from said sacrificial substrate.

9. The method of claim 1, wherein said plurality of elongated conductors are formed from a material selected from the group consisting of Au, Cu, Al, Ag, Ni and alloys thereof.

10. The method of claim 1, wherein said elongated conductor has a thin surface layer of a material selected from the group consisting of Au, Cr, Co, Ni, Pd and Pt.

11. The method of claim 10, wherein said surface layer is deposited by a method selected from the group consisting of electroplating, electroless plating; sputtering and c-beam evaporation.

12. The method of claim 1, wherein said step of curing comprises a first cure at a temperature less than about 60° C. and a second curing at a temperature of greater than about 80° C.

13. The method of claim 1, further including a frame on said mold to minimize shrinking during said step of curing.

14. The method of claim 1, wherein said liquid includes a foaming agent.

15. A method comprising the steps of:

providing a substrate;

providing a plurality of elongated conductors each having a first end and a second end;

bonding said first end of each of said plurality conductors to said substrate;

said second ends of said plurality of elongated conductors projects away from said substrate;

placing said substrate in a mold;

adding to said mold a liquid material;

curing said liquid to a solid body having said plurality of elongated conductors disposed therein and said substrate attached thereto;

removing said solid body from said mold;

removing said substrate from said solid body and from said first end of each of said plurality of said conductors, thereby leaving said solid body with said elongated conductors extending there through;

said first and said second ends of said elongated conductors being exposed at the surface of said solid body and said substrate has projections disposed thereon to form cavities on said solid body during said curing step, said cavities being disposed to permit said elongated conductors to move relative to each other when said elongated conductors are pressed against a surface;

and said substrate has pits resulting in projections on said solid body onto which said first end of at least a part of said plurality of elongated conductors is bonded.

* * * * *